(12) United States Patent
Andreev et al.

(10) Patent No.: US 6,757,881 B2
(45) Date of Patent: Jun. 29, 2004

(54) POWER ROUTING WITH OBSTACLES

(75) Inventors: Alexandre E. Andreev, San Jose, CA (US); Lav D. Ivanovic, Cupertino, CA (US); Ivan Pavisic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 143 days.

(21) Appl. No.: 10/059,480

(22) Filed: Jan. 29, 2002

(65) Prior Publication Data
US 2003/0145302 A1 Jul. 31, 2003

(51) Int. Cl.$^7$ ............................................. G06F 17/50
(52) U.S. Cl. ............................ 716/12; 716/13; 716/14
(58) Field of Search ............................. 716/2, 8, 9, 10, 716/11, 12, 13, 14, 15; 257/207, 204, 206, 288, 290

(56) References Cited

U.S. PATENT DOCUMENTS

| | | | | |
|---|---|---|---|---|
| 5,598,348 A | * | 1/1997 | Rusu et al. .................... 716/2 |
| 5,808,900 A | * | 9/1998 | Buer et al. ..................... 716/10 |
| 5,977,574 A | * | 11/1999 | Schmitt et al. ............. 257/207 |
| 6,308,307 B1 | * | 10/2001 | Cano et al. ..................... 716/8 |
| 6,321,371 B1 | * | 11/2001 | Yount, Jr. ..................... 716/17 |

* cited by examiner

*Primary Examiner*—Vuthe Siek
*Assistant Examiner*—Binh C Tat
(74) *Attorney, Agent, or Firm*—Suiter West PC LLO

(57) ABSTRACT

The present invention is directed to power routing with obstacles. A method for determining strap location for power routing in an integrated circuit may include receiving input parameters, the input parameters including a number N indicating a number of straps to be located, wherein a strap of the number of straps is denoted as i. An initial strap placement is found for 1 through N straps and strap placement is calculated by relocating a strap if an obstacle is encountered in an initial strap placement, the relocated strap utilized to relocate at least one other strap of the 1 through N straps. Strap placement may be calculated by employing a local gradient method, dynamic programming, and like methods as contemplated by a person of ordinary skill in the art without departing from the spirit and scope thereof.

27 Claims, 8 Drawing Sheets

Method 1. 4th layer, F= 12.218

Method 2. 4th layer, F= 12.178

Method 1. 5th layer, F= 9.326

Method 2. 5th layer, F= 9.273

Pins conection

US 6,757,881 B2

POWER ROUTING WITH OBSTACLES

FIELD OF THE INVENTION

The present invention generally relates to the field of integrated circuit design, and particularly to a system and method for power routing with obstacles in an integrated circuit.

BACKGROUND OF THE INVENTION

An integrated circuit chip (hereafter referred to as an "IC" or a "chip") comprises cells and connections between the cells formed on a surface of a semiconductor substrate. The IC may include a large number of cells and require complex connections between the cells.

Microelectronic integrated circuits include a large number of electronic components that are fabricated by layering several different materials on a silicon base or wafer. The design of an integrated circuit transforms a circuit description into a geometric description, which is known as a layout. A layout includes a set of planar geometric shapes in several layers.

To provide power to the various components, a power mesh is provided. For example, in designs with at least five layers, a power mesh usually lays in the $4^{th}$ and $5^{th}$ layer. If the design of the integrated circuit includes hardmacros, memories and megacells such that power mesh is allowed to run on top of them, various obstacles may be encountered, such as megacells, pins, routing blocks and the like. Because of these obstacles, an equidistant power mesh typically cannot be provided, and the designer has to solve conflicts manually.

Therefore, it would be desirable to provide a system and method for providing a power mesh in an efficient manner.

SUMMARY OF THE INVENTION

Accordingly, the present invention is directed to a system and method for providing a power mesh for an integrated circuit in an efficient manner.

In a first aspect of the present invention, a method for determining strap location in an integrated circuit for power routing includes receiving input parameters for strap placement, the input parameters including 1 through N number of straps, wherein a strap of the number of straps is denoted as i. A middle point for a strap i located between a first strap i+1 and a second strap i−1 is calculated, wherein if the middle point is feasible, the calculated middle point is utilized as a location for strap i.

In a second aspect of the present invention, a method for determining strap location for power routing in an integrated circuit includes receiving input parameters, the input parameters including a number N indicating a number of straps to be located, wherein a strap of the number of straps is denoted as i. An initial strap placement is found for 1 through N straps and strap placement is calculated by relocating a strap if an obstacle is encountered in an initial strap placement, the relocated strap utilized to relocate at least one other strap of the 1 through N straps. Strap placement may be calculated by employing a local gradient method, dynamic programming, and like methods as contemplated by a person of ordinary skill in the art without departing from the spirit and scope thereof.

In a third aspect of the present invention, a system suitable for determining power routing in an integrated circuit without user intervention from received parameters includes a memory suitable for performing a program of instructions and a processor communicatively coupled to the memory, wherein the program of instruction configures the processor to receive input parameters, the input parameters including a number N indicating a number of straps to be located, wherein a strap of the number of straps is denoted as i. An initial strap placement is found for 1 through N straps and strap placement is calculated by relocating a strap if an obstacle is encountered in an initial strap placement, the relocated strap utilized to relocate at least one other strap of the 1 through N straps.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
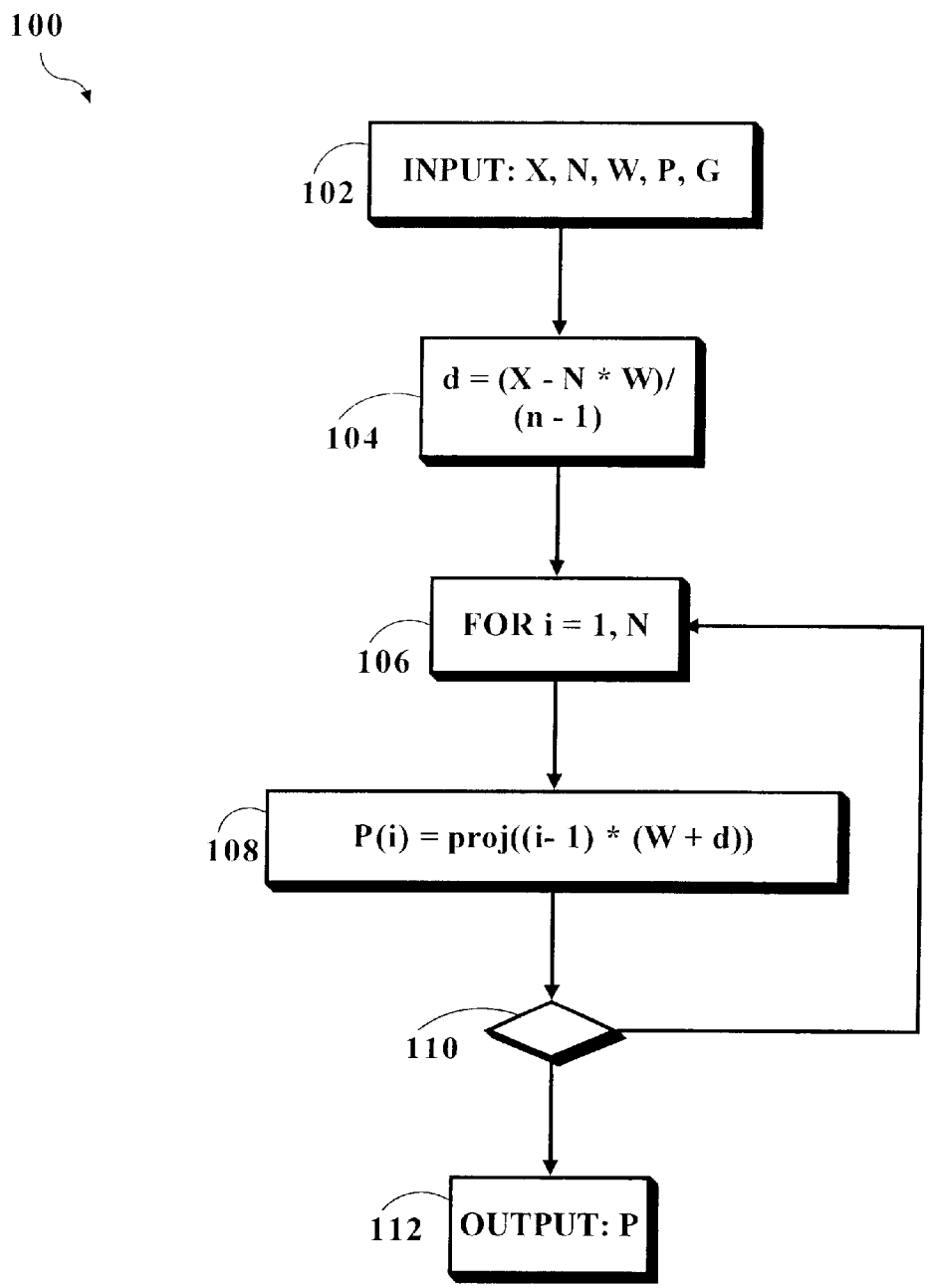
FIG. 1 is a flow diagram depicting an exemplary method of the present invention wherein a first iteration is performed for determining strap placement.

Reference will now be made in detail to the presently preferred embodiments of the invention, examples of which are illustrated in the accompanying drawings.

Referring generally now to FIGS. 1 through 8, exemplary embodiments of the present invention are shown. To provide power to the various components, a power mesh is provided in the integrated circuit. For example, in designs with at least five layers, a power mesh usually lays in the $4^{th}$ and $5^{th}$ layer. If the design of the integrated circuit includes hardmacros, memories, megacells, and the like such that power mesh is allowed to run on top of them, various obstacles may be encountered, such as megacells, pins, routing blocks and the like. Because of these obstacles, an equidistant power mesh typically cannot be provided, and the designer has to solve conflicts manually, such as by moving megacells, moving straps, and the like.

The present invention provides a system and method for automated power mesh routing and pin connections without manual intervention. Through use of the present invention, a power mesh may be built as close as possible to the ideal equidistant mesh without any impact on floor plan.

Standard equidistant power mesh grid typically comprises pairs of straps (power and ground). The present embodiments will describe a power mesh with alternating power and ground straps, although other configurations are contemplated by the present invention without departing from the spirit and scope thereof.

For instance, in an embodiment of the invention, assume that straps in $4^{th}$ layer are vertical and in $5^{th}$ layer are horizontal. First, orthogonal projections or power and ground obstacles onto x and y axes are found. A set G of disjoint intervals is calculated $[g_I, g_{I+1}]\_[o,X]$, i=1, . . . , k for ground straps possible routing positions in the $4^{th}$ layer (X is maximal coordinate) and set P of disjoint intervals $[p_i, p_{i+1}]\_[0,X]$, i=1, . . . , k for power straps possible routing in the $4^{th}$ layer.

In the same manner, sets may be found for straps routing in the $5^{th}$ layer. Let $N_4$ denote the number of straps (power and ground) in the $4^{th}$ layer and with $W_4$ strap width in the $4^{th}$ layer and respectively $N_5$ and $W_5$ in the $5^{th}$ layer.

The strap positions in the $4^{th}$ layer ($5^{th}$ layer) are determined such that straps alternate (power and ground) as close as possible to equidistant positions and power strap orthogonal projection on x axis (y axis) belong to P and ground strap projection on x axis (y axis) belong to G. A set of all possible straps positions will be referred to as a "feasible set".

Notation proj(x) refers to the nearest possible point to the point x (every point has polarity power or ground). Formally if strap positions are in a feasible set, global minimums of the following functions are found:

$$F_4(d) = \sum_{i=1}^{N_4-1} (d_i - d_{4opt})^2$$

and $$F_5(d) = \sum_{i=1}^{N_5-1} (d_i - d_{5opt})^2$$

where d is the vector with coordinates di denotes distance between straps i and i+1 and $d_{4opt}$ denotes ideal distance in $4^{th}$ layer and $d_{5opt}$ denotes ideal distance between straps in $5^{th}$ layer. The feasible set may be shown as non-convex.

A variety of methods may be employed by the present invention to address these concerns. In both methods, a first iteration is found which is feasible and as close as possible to the ideal solution.

Referring now to FIG. 1, an exemplary method 100 of the present invention is shown wherein strap positions for an integrated circuit in a first iteration are computed. The maximal coordinate x, the number of straps per layer N, the strap width W, set of intervals for power straps p, and set of intervals for ground straps G are input 102 into a system employing the method of the present invention. The distance d between the straps is computed 104, which is equal to (x−N*W)/(N−1). For i=1, N 106, P(i)=proj(i−1)*(w+d) 108. This is repeated 110 for each of the straps and once a set is obtained the system employing this method outputs p 112.

Next a method is employed to optimize strap placement in relation to encountered obstacles and the like. A variety of methods may be employed, the first of which that will be discussed is a local gradient method. The first and last strap positions are fixed and calculated in the first iteration. For every strap (except first and last), a middle point between adjacent straps is found. If that middle point is feasible, then it is used as the new position of the strap. If the middle point is not feasible then a nearest feasible point if found and the strap is located in that new position. The procedure proceeds while straps are moving significantly. Without obstacles this method converges to the ideal solution and with obstacles it converges to the local minimum.

Figure 2:
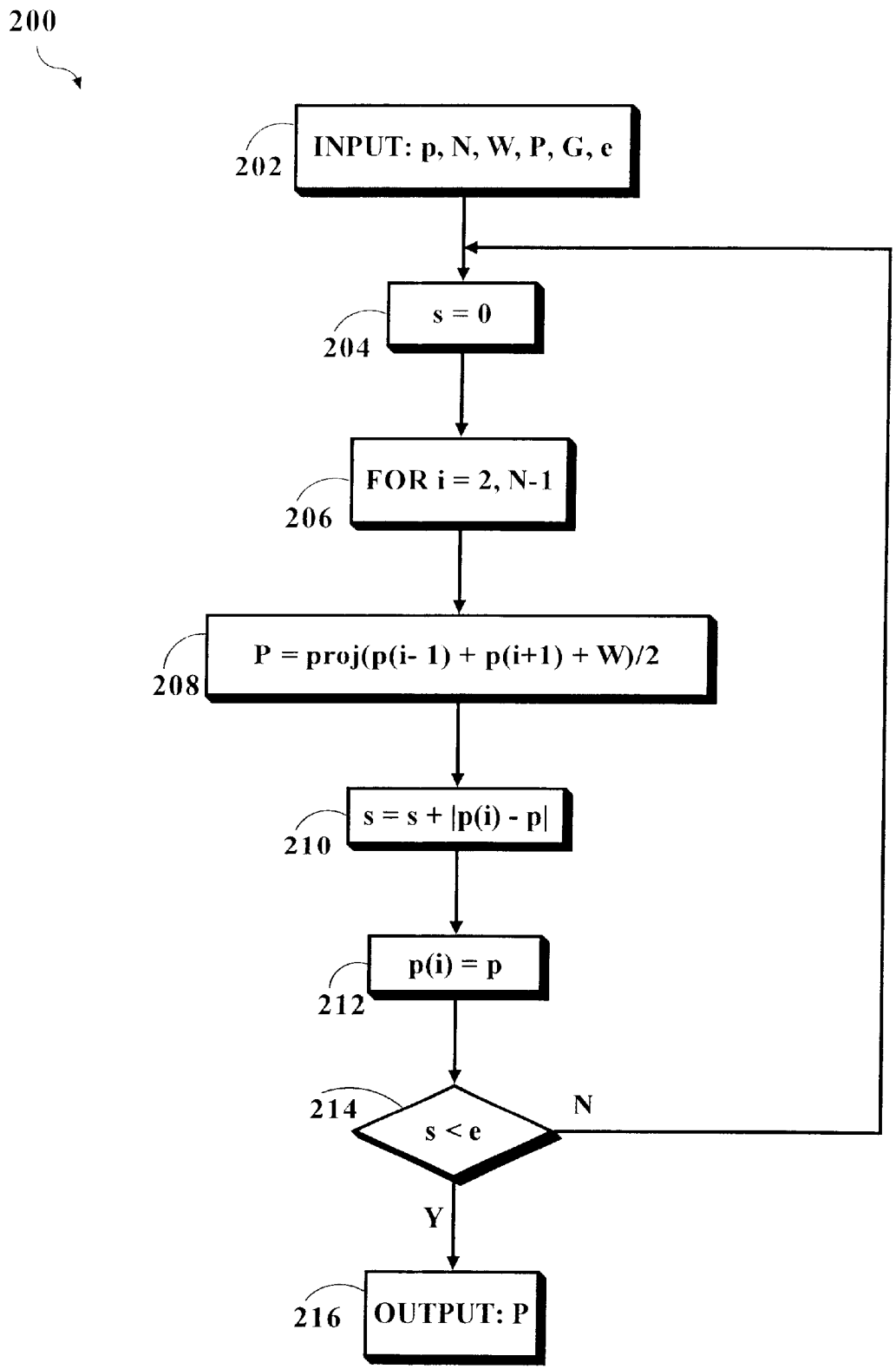
FIG. 2 is a flow diagram depicting an exemplary method of the present invention wherein strap positions are determined utilizing a local gradient method.

For instance, referring now to FIG. 2, an exemplary method 200 of the present invention is shown wherein power routing with obstacles utilizes a local gradient method. The number of straps per layer N, the strap width W, set of intervals for power straps P, and set of intervals for ground straps G, p and user definer error level, e are input 202 into a system employing the method of the present invention, and s is set equal to zero 204. For i=2, N−1 206, p=proj(p(i−1)+p(i+1)+W)/2 208. The value s is set equal to s+|p(i)−p| 210 and p(i) is set equal to p 212. If s is less than e 214, the system outputs p 216. However, if s is not less than e 214, the process is repeated. Thus, a local minimum may be computed for the strap placement to optimize placement of straps in relation to encountered obstacles.

An additional method suitable for being employed by the present invention is based on dynamic programming data. For instance, let $x_i$i denote i-strap position found in the first iteration described above. A set $D_i$ may be defined as follows: $[x_i−a, x_i+a]$ (a is the parameter) and set $D^*_i$ provided to denote all possible points from $D_i$. Then, the following cost function may be calculated for every $x \in D^*_i$:

$$F_i(x) = \min_{y \in D^*_{i-1}}(F_{i-1}(y) + (x - y - d_{opt})^2)$$

Let us denote with $y(x,i) = \text{argmin}(F_i(x))$. For i=1 and i=N, let a=0. Starting with $F_N(x)$ all strap positions $x_i = y(x, i+1)$ may be backwards calculated.

Figure 3:
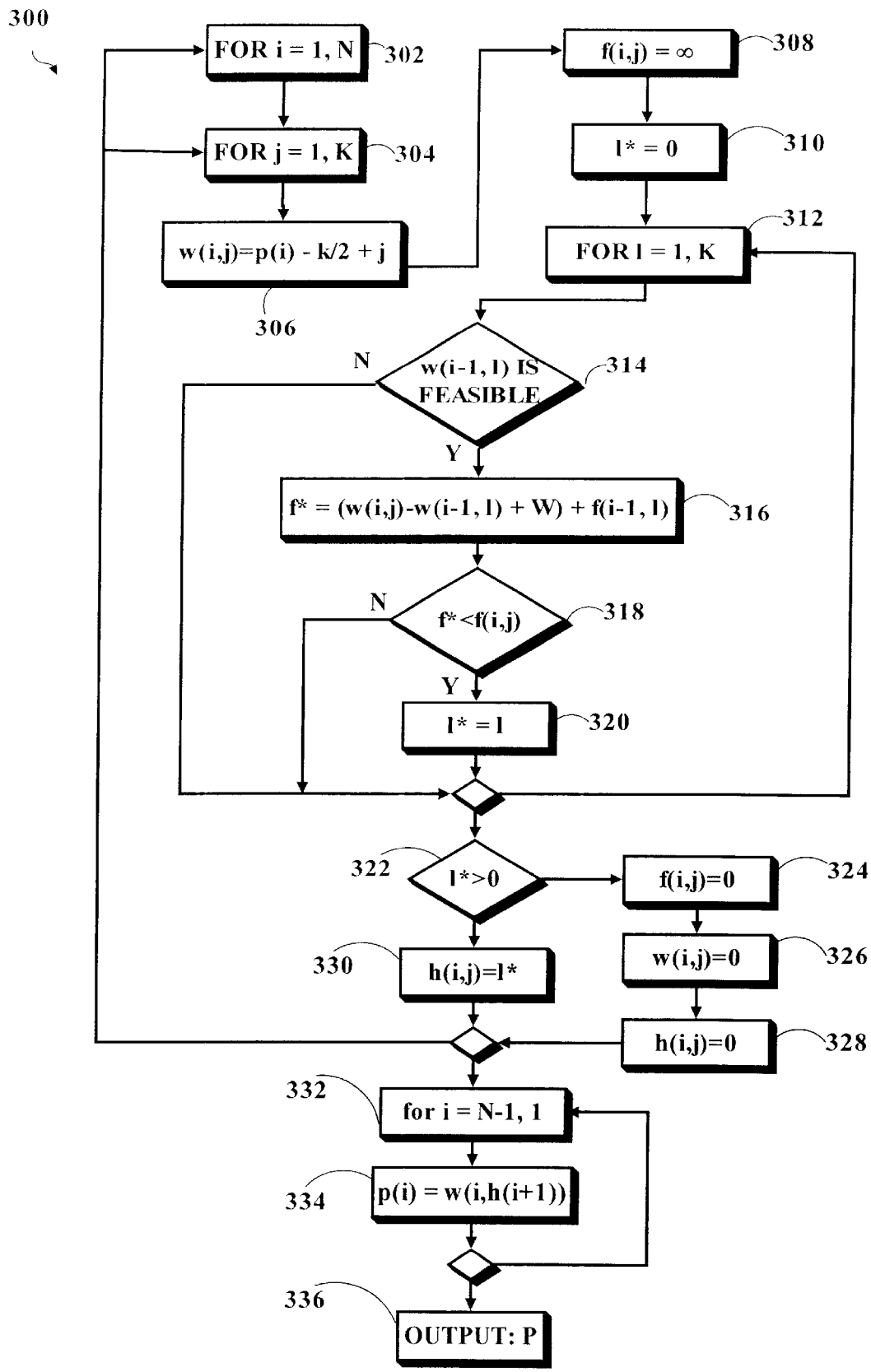
FIG. 3 is a flow diagram depicting an exemplary method of the present invention wherein strap positions are determined utilizing a dynamic programming method.
Figure 4:
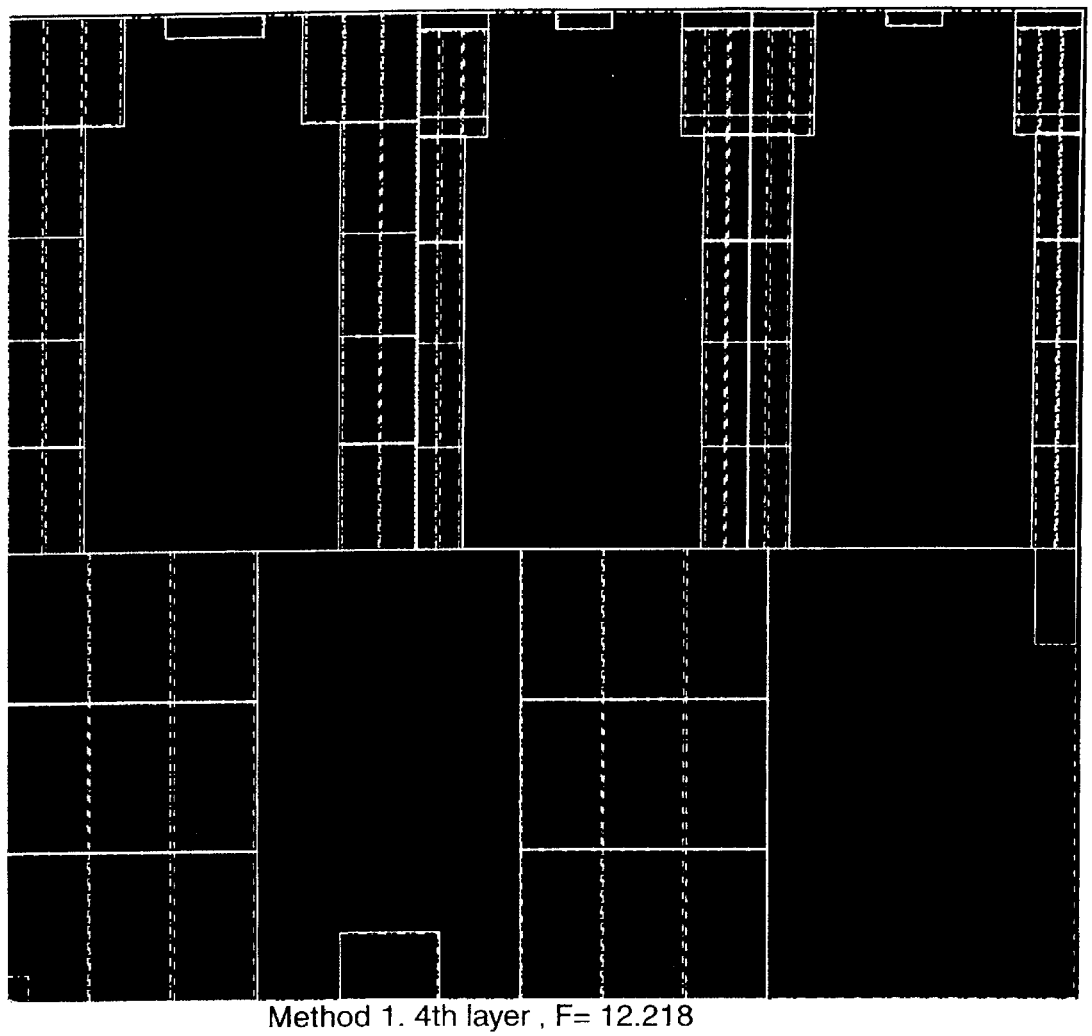
FIGS. 4–8 are illustrations of exemplary power routing.
Figure 5:
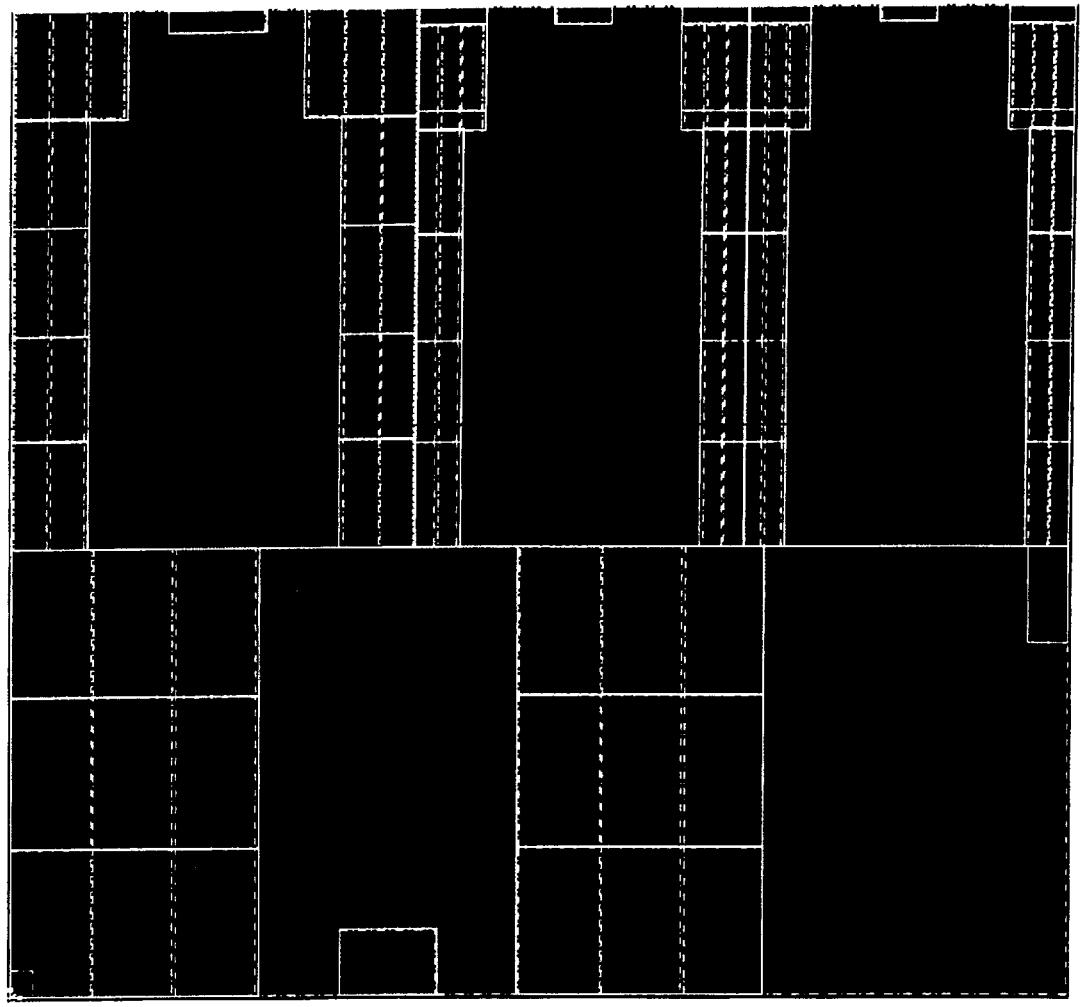
Figure 6:
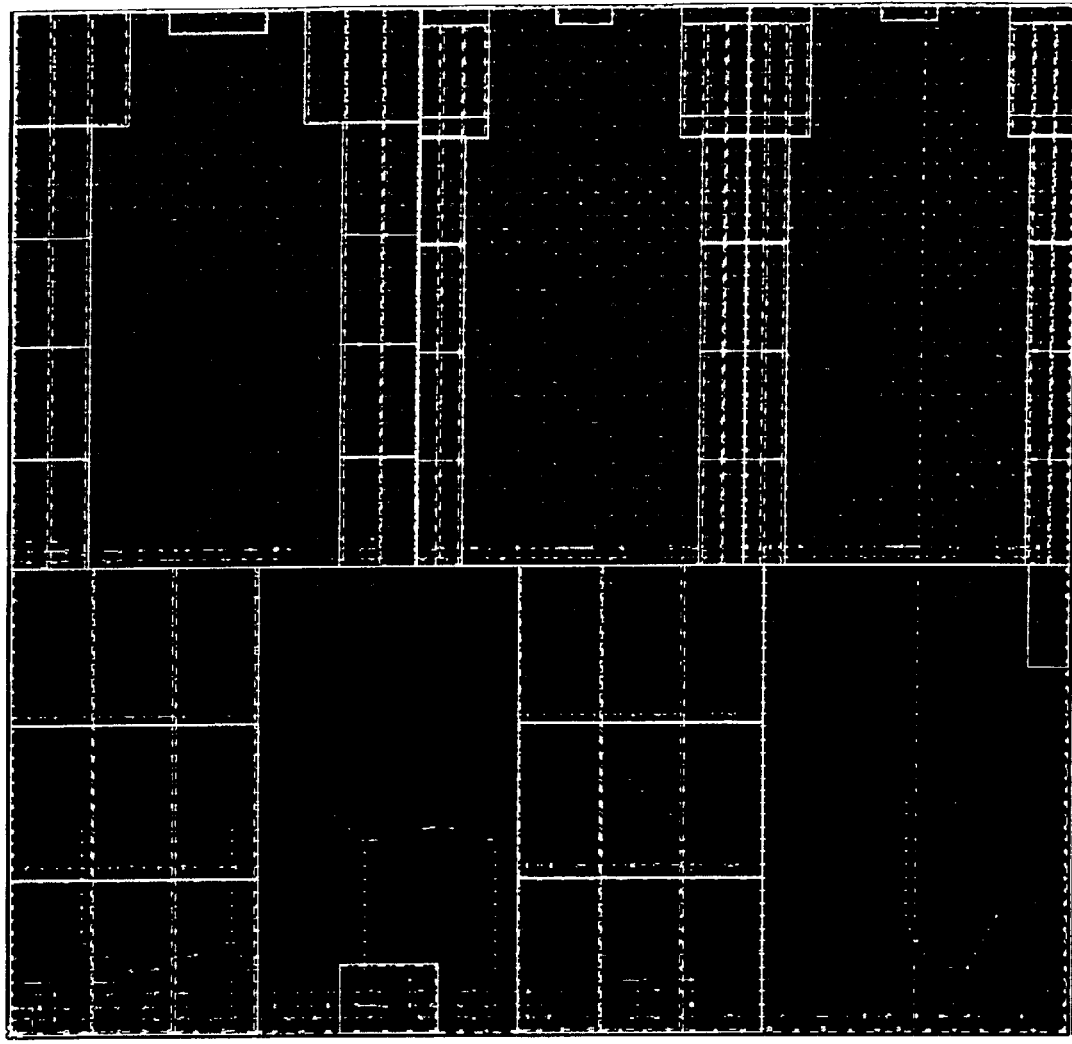
Figure 7:
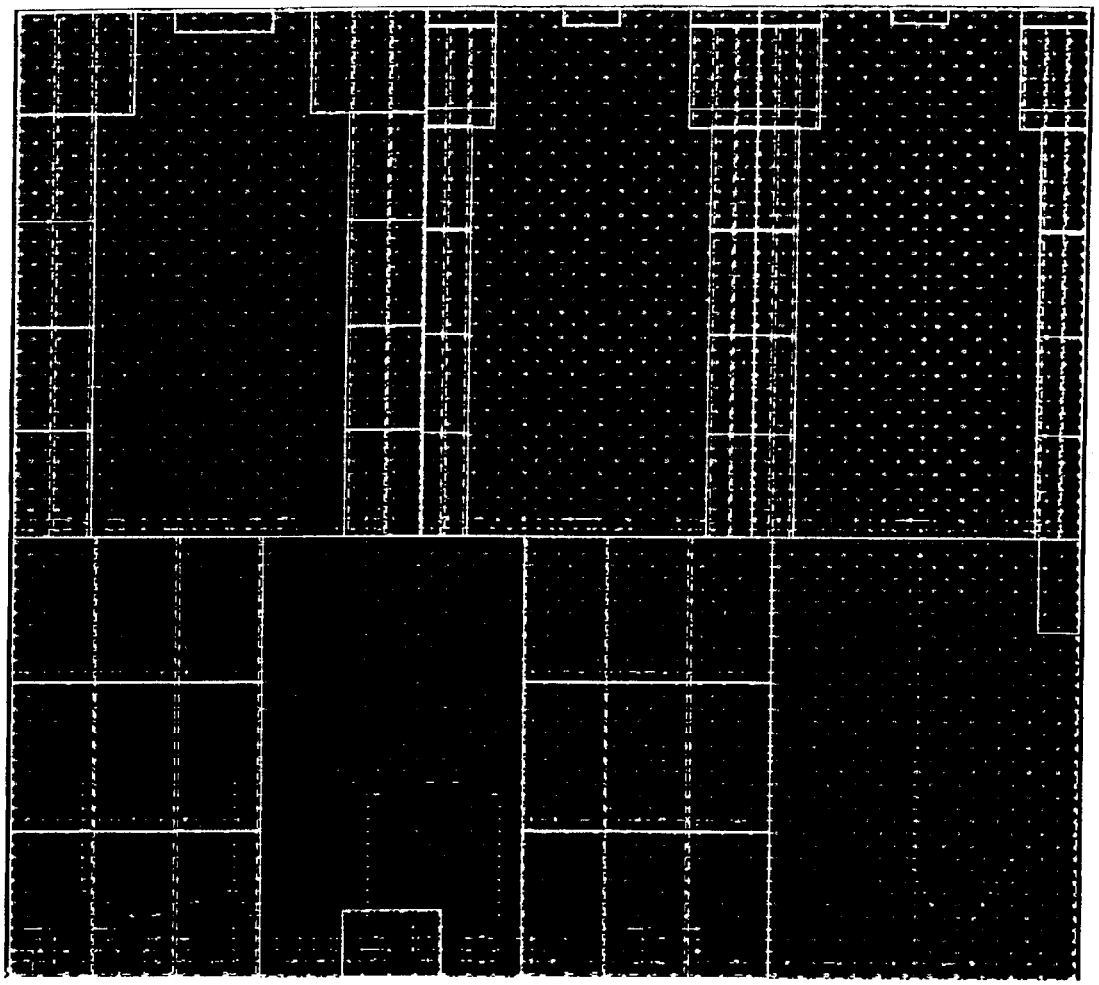
Figure 8:
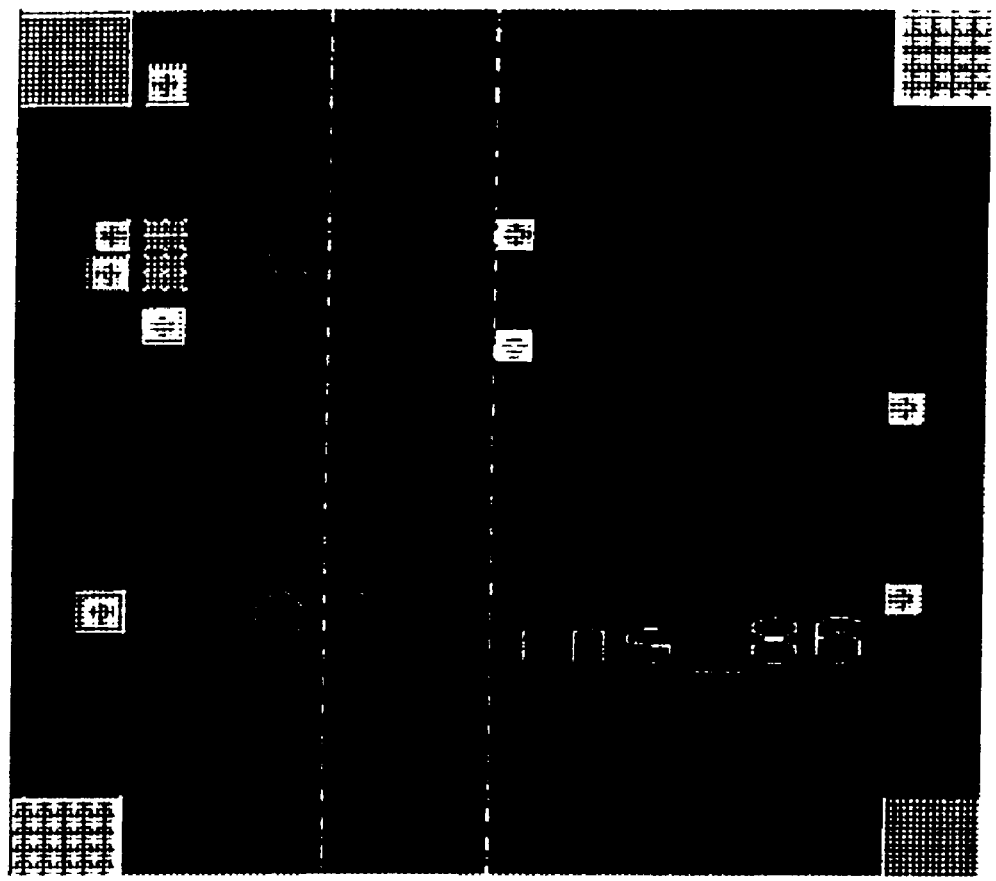

For example, referring now to FIG. 3, an exemplary method 300 of the present invention is shown wherein dynamic programming data is utilized to provide strap position in a system of the present invention. For straps i=1, N 302 and for j=1, k 304 wherein j is the counter, and k=2*a. For w(i,j) is equal to p(i)−k/2+j 306, f(i,j) is set equal to infinity 308, 1* is set equal to zero 310 and for l, the position counter, is set equal to 1, k 312.

A determination is then made as to whether w(i−1, l) is feasible. If w(i−1, l) is feasible, f* is calculated by performing the following computation, (w(i,j)−w(i−1, l)+W)+f(i−1, l). If f* is less than f(i,j), 1*, the optimal position, is set equal to the position counter, l 320, otherwise the process repeats beginning at step 312.

Next a determination is made as to whether l* is greater than zero 322, and if yes, f(i,j), w(i,j) and h(i,j) are set equal to zero 324, 326 & 328 and the process returns to steps 302 & 304 wherein the inner j loop shown in FIG. 3 is processed first, after which the next i is processed, otherwise, h(i,j) is set equal to l* 330. For i=N−1, 1 332 and p(i)=w(i,h(i+1)) 334. The system then outputs p 336.

Thus, by utilizing the present invention, parameters are received, an initial placement for the straps is found and the placement of the straps is calculated to overcome obstacles encountered in the initial placement in an optimized manner.

The method described in FIG. 2 is fast, use small amount of memory but it can find only local minimum. The method described in FIG. 3 uses more memory and run time is longer but it can find optimal solution (depends on the size of the parameter a). The next step is to connect megacells pins to straps. For example, such a connection may be performed inside the smallest strap rectangular FIG. 8 in the standard way as understood by a person of ordinary skill in the art without departing from the spirit and scope thereof.

Examples of strap routing are presented in FIG. 4, FIG. 5, FIG. 6 and FIG. 7. Design has 88 memories and fixed floor plan. There are 994 power pins and 862 ground pins. Routing blockages are also included. Power pins and rout blockages are obstacles for ground straps and ground pins and route blockages are obstacles for power straps.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for determining strap location in an integrated circuit for power routing, comprising:
   receiving input parameters for strap placement, the input parameters including 1 through N number of straps, wherein a strap of the number of straps is denoted as i; and
   calculating a middle point for a strap i located between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle.

2. The method as described in claim 1, wherein middle points are calculated for straps 2 through N−1.

3. The method as described in claim 1, wherein an obstacle includes at least one of a power pin, ground pin and route blockage.

4. The method as described in claim 1, wherein the N straps include at least one of a power strap and a ground strap.

5. A method for determining strap location in an integrated circuit for power routing, comprising:
   receiving input parameters for strap placement, the input parameters including 1 through N number of straps, wherein a strap of the number of straps is denoted as i;
   calculating a middle point for a strap i located between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle; and
   arriving at an initial placement for the 1, N straps, the initial placement computed by the following procedure: distance d between straps is equal to $(x-N*W)/(N-1)$, for i=1, N; the set of intervals for straps is equal to $proj(i-1)*(w+d)$, wherein x is a maximal coordinate, N is number of straps per layer, W is strap width, and $proj(x)$ denotes a nearest possible point to point x.

6. A method for determining strap location in an integrated circuit for power routing, comprising:
   receiving input parameters for strap placement, the input parameters including 1 through N number of straps, wherein a strap of the number of straps is denoted as i; and
   calculating a middle point for a strap i located between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle,
   wherein the middle point calculated utilizing the following procedure: location for strap i is equal to $(proj(p(i-1)+p(i+1)+W)/2)$, wherein W is strap width, and $proj(x)$ denotes a nearest possible point to point (x).

7. The method as described in claim 6, wherein s is set equal to zero, and location for strap is equal to $proj(p(i-1)+p(i+1)+W)/2$, s is set equal to $s+|p(i)-p|$ and $p(i)$ is set equal to p, if s is less than a user defined error, e, the system outputs p, however, if s is not less than e, the process is repeated.

8. A method for determining strap location for power routing in an integrated circuit, comprising:
   receiving input parameters, the input parameters including a number N indicating a number of straps to be located, wherein a strap of the number of straps is denoted as i;
   finding an initial strap placement for 1 through N straps; and
   calculating strap placement by relocating a strap if an obstacle is encountered in an initial strap placement, the relocated strap utilized to relocate at least one other strap of the 1 through N straps,
   wherein calculating includes determining a middle point for placement of a strap i disposed between a first strap i+1 and a second strap i−1, wherein if the middle point is feasible, the calculated middle point is utilized as a location for strap i wherein if the calculated middle point is not feasible, a nearest feasible point to the calculated middle point is utilized as a location for strap i, and wherein the calculated middle point is feasible if the middle point does not encounter an obstacle.

9. The method as described in claim 8, wherein middle points are calculated for straps 2 through N−1.

10. The method as described in claim 8, wherein the calculated middle point is feasible if the middle point does not encounter an obstacle, wherein an obstacle includes at least one of a power pin, ground pin and route blockage.

11. The method as described in claim 8, wherein the N straps include at least one of a power strap and a ground strap.

12. The method as described in claim 8, wherein calculating includes utilizing dynamic programming to determine strap placement.

13. A method for determining strap location for power routing in an integrated circuit, comprising:
receiving input parameters, the input parameters including a number N indicating a number of straps to be located, wherein a strap of the number of straps is denoted as i;
finding an initial strap placement for 1 through N straps; and
calculating strap placement by relocating a strap if an obstacle is encountered in an initial strap placement, the relocated strap utilized to relocate at least one other strap of the 1 through N strap, calculating a middle point for a strap i located between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle,
wherein the initial placement is computed by the following procedure: distance d between straps is equal to (x−N*W)/(N−1),for i=1, N; the set of intervals for straps is equal to proj(i−1)*(w+d), wherein x is a maximal coordinate, N is number of straps per layer, W is strap width, and proj(x) denotes a nearest possible point to point x.

14. A method for determining strap location for power routing in an integrated circuit, comprising:
receiving input parameters, the input parameters including a number N indicating a number of straps to be located, wherein a strap of the number of straps is denoted as i;
finding an initial strap placement for 1 through N straps; and
calculating strap placement by relocating a strap if an obstacle is encountered in an initial strap placement, the relocated strap utilized to relocate at least one other strap of the 1 through N straps,
wherein calculating includes utilizing a local gradient procedure to determine strap placement, wherein calculating includes determining a middle point for placement of a strap i disposed between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle,
wherein the middle point is calculated utilizing the following procedure: location for strap i is equal to (proj(p(i−1)+p(i+1)+W)/2), wherein W is strap width, and proj(x) denotes a nearest possible point to point x.

15. The method as described in claim 14, wherein s is set equal to zero, and location for strap is equal to proj(p(i−1)+p(i+1)+W)/2, s is set equal to s+|p(i)−p| and p(i) is set equal to p, if s is less than a user defined error, e, the system outputs p, however, if s is not less than e, the process is repeated.

16. A method for determining strap location for power routing in an integrated circuit, comprising:
receiving input parameters, the input parameters including a number N indicating a number of straps to be located, wherein a strap of the number of straps is denoted as i;
finding an initial strap placement for 1 through N straps; and
calculating strap placement by relocating a strap if an obstacle is encountered in an initial strap placement, the relocated strap utilized to relocate at least one other strap of the 1 through N straps, calculating a middle point for a strap i located between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle,
wherein calculating includes utilizing dynamic programming to determine strap placement, and
wherein utilizing dynamic programming to determine strap placement includes utilizing a cost function as follows: for every $_{x \in D^*i}$, $F_i(x) = \min_{y \in D^*_{i-1}}(F_{i-1}(y)+(x-y-d_{opt})^2)$, wherein $x_i$ denotes i-strap position found in the first iteration described above, set $D_i$ is defined as follows: $[x_i-a, x_i+a]$ (a is a parameter), and set $D^*_i$ provided to denote all possible points from $D_i$.

17. The method as described in claim 16, wherein the following method is utilized to compute strap placement:
(a) for straps i=1, N;
(b) for j=1,k wherein j is the counter, and k=2*a;
(c) w(i, j)=p(i)−k/2+j;
(d) f(i,j)=∞;
(e) l*=zero;
(f) for l=1, k;
(g) Determine whether w(i−1, l) is feasible;
(h) If w(i−1, l) is not feasible, the method returns to step (f);
(i) If w(i−1, l) is feasible f*=(w(i,j)−w(i−1, l)+W)+f(i−1, l);
(j) If f* is less than f(i,j), l* is set equal to l, and f(i,j)=f* and the method returns to step (f);
(k) If f* is not less than f(i,j), the method returns to step (f);
(l) Determine whether l* is greater than zero;
(m) If l* is greater than zero, f(i,j), w(i,j) and h(i,j) are set equal to zero and the method returns to steps (a) and (b) wherein j=1,k is calculated for every i;
(n) If l* is not greater than zero, h(i,j) is set equal to l* and the method returns to steps (a) and (b) wherein j=1,k is calculated for every i;

(o) For i=N−1, 1;

(p) p(i)=w(i,h(i+1)), wherein the method returns to step (o) for every i=N−1, 1;and (q) output p.

18. A system suitable for determining power routing in an integrated circuit without user intervention from received parameters, comprising:
a memory suitable for performing a program of instructions, and
a processor communicatively coupled to the memory, wherein the program of instruction configures the processor to
receive input parameters, the input parameters including a number N indicating a number of straps to be located, wherein a strap of the number of straps is denoted as i;
find an initial strap placement for 1 through N straps; and
calculate strap placement without user intervention by relocating a strap if an obstacle is encountered in an initial strap placement, the relocated strap utilized to relocate at least one other strap of the 1 through N straps,
wherein the step to calculate includes determining a middle point for placement of a strap i disposed between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle.

19. The system as described in claim 18, wherein middle points are calculated for straps 2 through N−1.

20. The system as described in claim 18, wherein the calculated middle point is feasible if the middle point does not encounter an obstacle, wherein an obstacle includes at least one of a power pin, ground pin and route blockage.

21. The system as described in claim 18, wherein the N straps include at least one of a power strap and a ground strap.

22. The system as described in claim 18, wherein dynamic programming is utilized to calculate strap placement.

23. A system suitable for determining power routing in an integrated circuit without user intervention from received parameters, comprising:
a memory suitable for performing a program of instructions, and
a processor communicatively coupled to the memory, wherein the program of instruction configures the processor to
receive input parameters, the input parameters including a number N indicating a number of straps to be located, wherein a strap of the number of straps is denoted as i;
find an initial strap placement for 1 through N straps; and
calculate strap placement without user intervention by relocating a strap if an obstacle is encountered in an initial strap placement, the relocated strap utilized to relocate at least one other strap of the 1 through N straps, calculating a middle point for a strap i located between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle,
wherein the initial placement is computed by the following procedure: distance d between straps is equal to (x−N*W)/(N−1),for i=1, N; the set of intervals for straps is equal to proj(i−1)*(w+d), wherein x is a maximal coordinate, N is number of straps per layer, W is strap width, and proj(x) denotes a nearest possible point to point x.

24. A system suitable for determining power routing in an integrated circuit without user intervention from received parameters, comprising:
a memory suitable for performing a program of instructions, and
a processor communicatively coupled to the memory, wherein the program of instruction configures the processor to
receive input parameters, the input parameters including a number N indicating a number of straps to be located, wherein a strap of the number of straps is denoted as i;
find an initial strap placement for 1 through N straps; and
calculate strap placement without user intervention by relocating a strap if an obstacle is encountered in an initial strap placement, the relocated strap utilized to relocate at least one other strap of the 1 through N straps,
wherein the step to calculate includes determining a middle point for placement of a strap i disposed between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle, and
wherein the middle point is calculated utilizing the following procedure: location for strap i is equal to (proj(p(i−1)+p(i+1)+W)/2), wherein W is strap width, and proj(x) denotes a nearest possible point to point x.

25. The system as described in claim 24, wherein s is set equal to zero, and location for strap is equal to proj(p(i−1)+p(i+1)+W)/2, s is set equal to s+|p(i)−p| and p(i) is set equal to p, if s is less than a user defined error, e, the system outputs p, however, if s is not less than e, the process is repeated.

26. A system suitable for determining power routing in an integrated circuit without user intervention from received parameters, comprising:
a memory suitable for performing a program of instructions, and
a processor communicatively coupled to the memory, wherein the program of instruction configures the processor to
receive input parameters, the input parameters including a number N indicating a number of straps to be located, wherein a strap of the number of straps is denoted as i;
find an initial strap placement for 1 through N straps; and
calculate strap placement without user intervention by relocating a strap if an obstacle is encountered in an initial strap placement, the relocated strap utilized to relocate at least one other strap of the 1 through N straps, calculating a middle point for a strap i located between a first strap i+1 and a second strap i−1, wherein if the middle point is feasible, the calculated middle point is utilized as a location for strap i, wherein if the calculated middle point is not feasible, a nearest feasible point to the calculated middle point is utilized as a location for strap i, and wherein the calculated middle point is feasible if the middle point does not encounter an obstacle, wherein dynamic programming is utilized to calculate strap placement, and wherein utilizing dynamic programming to determine strap placement includes utilizing a cost function as follows: for every $_{x \in D^*_i}$, $F_i(x) = \min_{y \in D^*_{i-1}}(F_{i-1}(y) + (x-y-d_{opt})^2)$, wherein $x_i$i denotes i-strap position found in the first iteration described above, set $D_i$ is defined as follows: $[x_i-a, x_i+a]$ (a is a parameter), and set $D^*_i$ provided to denote all possible points from $D_i$.

27. The system as described in claim 26, wherein the following method is utilized to compute strap placement:

(a) for straps i=1, N;
(b) for j=1,k wherein j is the counter, and k=2*a;
(c) w(i, j)=p(i)−k/2+j;
(d) f(i,j)=∞;
(e) l*=zero;
(f) for l=1, k;
(g) Determine whether w(i−1, l) is feasible;
(h) If w(i−1, l) is not feasible, the method returns to step (f);
(i) If w(i−1, l) is feasible, f*=(w(i,j)−w(i−1, l)+W)+f(i−1, l);
(j) If f* is less than f(i,j), l* is set equal to l, and f(i,j)=f* and the method returns to step (f);
(k) If f* is not less than f(i,j), the method returns to step (f);
(l) Determine whether l* is greater than zero;
(m) If l* is greater than zero, f(i,j), w(i,j) and h(i,j) are set equal to zero and the method returns to steps (a) and (b) wherein j=1,k is calculated for every i;
(n) If l* is not greater than zero, h(i,j) is set equal to l* and the method returns to steps (a) and (b) wherein j=1,k is calculated for every i;
(o) For i=N−1, 1;
(p) p(i)=w(i,h(i+1)), wherein the method returns to step (o) for every i=N−1, 1;and
(q) output p.

* * * * *